(12) United States Patent
Liu et al.

(10) Patent No.: US 10,644,090 B2
(45) Date of Patent: May 5, 2020

(54) ORGANIC LIGHT-EMITTING DISPLAY PANEL AND ORGANIC LIGHT-EMITTING DISPLAY DEVICE

(71) Applicant: Shanghai Tianma Micro-Electronics Co., Ltd., Shanghai (CN)

(72) Inventors: Xinzhao Liu, Shanghai (CN); Kaihong Huang, Shanghai (CN); Yana Gao, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 16/392,632

(22) Filed: Apr. 24, 2019

(65) Prior Publication Data

US 2019/0252480 A1    Aug. 15, 2019

(30) Foreign Application Priority Data

Dec. 17, 2018    (CN) .......................... 2018 1 1541634

(51) Int. Cl.
*H01L 27/32*    (2006.01)

(52) U.S. Cl.
CPC ........ *H01L 27/3262* (2013.01); *H01L 27/326* (2013.01); *H01L 27/3276* (2013.01)

(58) Field of Classification Search
CPC ................ H01L 27/326–3265; H01L 27/3276
See application file for complete search history.

(56) References Cited

U.S. PATENT DOCUMENTS

2017/0200417 A1* 7/2017 Wu ....................... G09G 3/3291
2017/0206839 A1* 7/2017 Wu ....................... G09G 3/3233

* cited by examiner

*Primary Examiner* — Amar Movva
(74) *Attorney, Agent, or Firm* — Kilpatrick Townsend & Stockton, LLP

(57) ABSTRACT

The present disclosure provides an organic light-emitting display panel and an organic light-emitting display device. The display panel includes gate lines; data lines intersecting with and insulated from the gate lines; light-emitting control lines; pixel units; gate drive units electrically connected to the gate lines, and light-emitting control units electrically connected to the light-emitting control lines. The gate drive units and the light-emitting control units are arranged along an arc, which has a curvature radius of R, where R>0. Each of the light-emitting control units corresponds to n gate drive units of the gate drive units, where n is an integer larger than 1. Each of the light-emitting control units includes m straight portions, where m is an integer and 1<m≤n. An included angle between two adjacent straight portions of the m straight portions is smaller than 180°.

19 Claims, 10 Drawing Sheets

100

ORGANIC LIGHT-EMITTING DISPLAY PANEL AND ORGANIC LIGHT-EMITTING DISPLAY DEVICE

CROSS-REFERENCE TO RELATED APPLICATIONS

The present application claims priority to Chinese Patent Application No. 201811541634.2, filed on Dec. 17, 2018, the content of which is incorporated herein by reference in its entirety.

FIELD

The present disclosure relates to the field of display technologies, and in particular, to an organic light-emitting display panel and an organic light-emitting display device.

BACKGROUND

In the existing display device technologies, display panels mainly include a liquid crystal display panel and an organic light-emitting display panel. For the liquid crystal display panel, an electric field capable of controlling deflection of liquid crystal molecules is formed by applying a voltage to a pixel electrode and a common electrode, thereby controlling transmission of light to achieve the display function of the liquid crystal display panel. The organic self-light-emitting display panel uses an organic electroluminescent material. When an electric current passes through the organic electroluminescent material, the luminescent material emits light, thereby achieving the display function of the organic light-emitting display panel.

With the application of display technologies in smart wears and other portable electronic devices, the design for electronic products focuses on pursuing a smooth use experience and a higher proportion of a display region. Recently, electronic products with a notch screen, a water-drop-like screen or the like have appeared in the market. For such electronic products, regions other than a region of an imaging device or a sounding device all perform display. It can be seen that, the display panel has gradually changed from a rectangular display panel to a non-rectangular display panel, i.e., to an abnormal-shaped display panel, especially a display panel having a rounded corner or an arc-shaped edge. A problem in the related art that need to be solved in this field is to further reduce an area of a border of the abnormal-shaped display panel (especially the display panel having a rounded corner or an arc-shaped edge), thereby further increasing the proportion of the display region.

SUMMARY

The present disclosure provides an organic light-emitting display panel and an organic light-emitting display device, aiming to reduce an area of a border of an abnormal-shaped display panel (especially a display panel having a rounded corner or an arc-shaped edge), thereby further increasing the proportion of the display region.

In one embodiment of the present disclosure provides an organic light-emitting display panel, including: a plurality of gate lines; a plurality of data lines intersecting with and insulated from the plurality of gate lines; a plurality of light-emitting control lines; a plurality of pixel units; a plurality of gate drive units electrically connected to the plurality of gate lines; and a plurality of light-emitting control units electrically connected to the plurality of light-emitting control lines. The plurality of gate drive units and the plurality of light-emitting control units are arranged along an arc, which has a curvature radius of R, where R>0. Each of the plurality of light-emitting control units corresponds to n gate drive units of the plurality of gate drive units, where n is an integer larger than 1. Each of the plurality of light-emitting control units includes m straight portions, where m is an integer and $1<m\leq n$. An included angle between two adjacent straight portions of the m straight portions is smaller than 180°.

In another embodiment of the present disclosure provides an organic light-emitting display device, including the organic light-emitting display panel described above.

BRIEF DESCRIPTION OF DRAWINGS

Embodiments of the present disclosure, the accompanying drawings used in the embodiments and in the related art are briefly introduced as follows. It should be noted that the drawings described as follows are merely part of the embodiments of the present disclosure.

DESCRIPTION OF EMBODIMENTS

Embodiments of the present disclosure are understandable, and the embodiments of the present disclosure are described in the following with reference to the accompanying drawings. It should be understood that the described embodiments are merely exemplary embodiments of the present disclosure, which shall not be interpreted as providing limitations to the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that, although a connection line, an included angle, and a straight portion may be described using the terms of "first", "second", "third", etc., in the embodiments of the present disclosure, the connection line, the included angle, and the straight portion will not be limited to these terms. These terms are merely used to distinguish connection lines, included angles, and straight portions from one another. For example, without departing from the scope of the embodiments of the present disclosure, a first connection line, a first included angle, and a first straight portion may also be referred to as a second connection line, a second included angle, and a second straight portion, respectively. Similarly, a second connection line, a second included angle, and a second straight portion may also be referred to as a first connection line, a first included angle, and a first straight portion, respectively.

Figure 1:
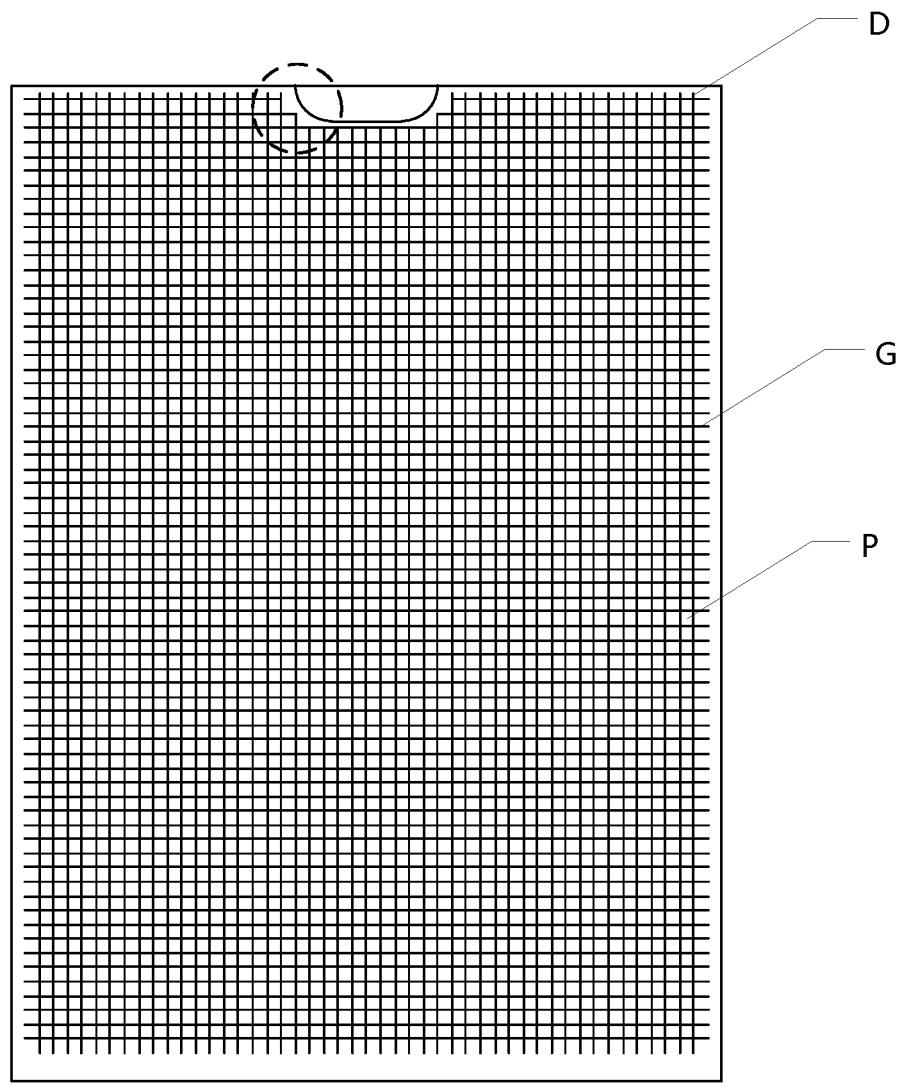
FIG. 1 is a top view of an organic light-emitting display panel according to an embodiment of the present disclosure.
Figure 2:
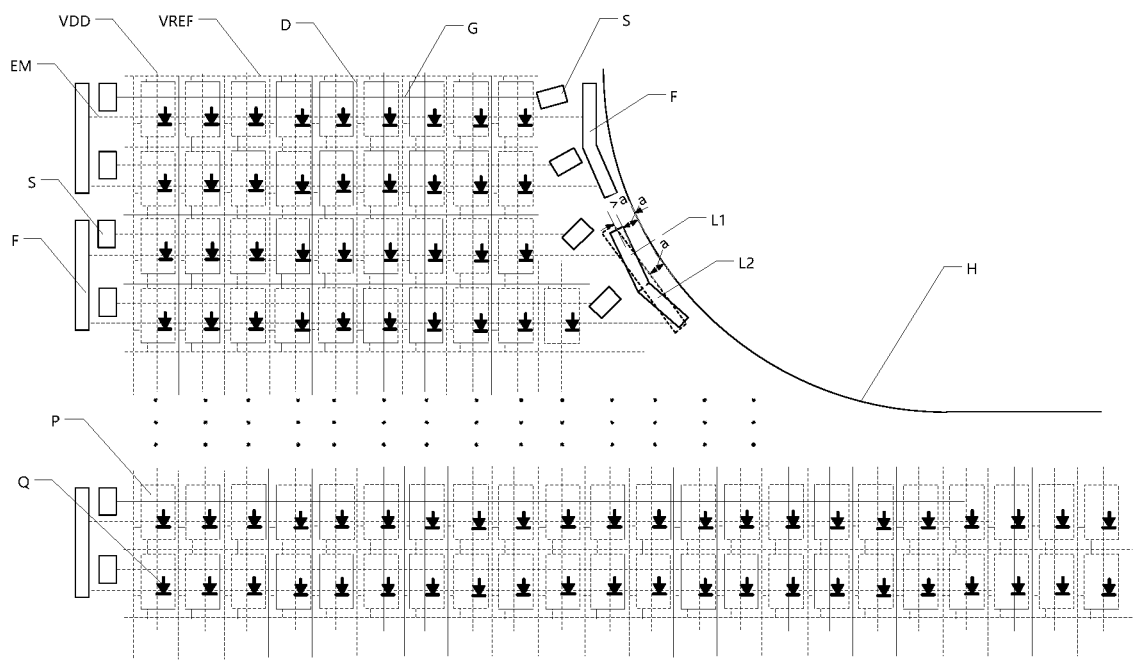
FIG. 2 is an enlarged view of an arc-shaped edge of an organic light-emitting display panel according to an embodiment of the present disclosure.

An embodiment of the present disclosure provides an organic light-emitting display panel 100. FIG. 1 is a top view of an organic light-emitting display panel 100 according to an embodiment of the present disclosure, and FIG. 2 is an enlarged view of an arc-shaped edge of the organic light-emitting display panel 100 according to an embodiment of the present disclosure. As shown in FIG. 1 and FIG. 2, the organic light-emitting display panel 100 includes gate lines G, data lines D, pixel units P, and light-emitting control lines EM. The pixel unit P includes light-emitting elements Q that can emit light of various colors such as red light, green light, blue light, and yellow light. A gate line G and a data line D connected to a pixel unit in which a light-emitting element Q is arranged cooperate with each other to drive the light-emitting element Q to emit light to perform display. The plurality of data lines D intersects with and is insulated from the plurality of gate lines G to form an array of pixels for the organic light-emitting display panel 100. An extending direction of the light-emitting control line EM is substantially the same as an extending direction of the gate line G, so as to provide a light-emitting control signal to the light emitting element Q.

With further reference to FIG. 1 and FIG. 2, the organic light-emitting display panel 100 further includes gate drive units S and light-emitting control units F. The gate drive unit S is electrically connected to the gate line G for providing a gate scanning signal. The light-emitting control unit F is electrically connected to the light-emitting control line EM for providing a light-emitting control signal. The gate drive units S and the light-emitting control units F are arranged along an arc H. Herein, the arc H is an arc edge of the display panel, the gate drive units S and the light-emitting control units F are arranged on a same side of the arc H, and a notch or a water-drop like hole may be located on the other side of the arc H. The arc H has a curvature radius of R, and R is a larger than zero. It should be noted that, as shown in FIG. 2, the organic light-emitting display panel 100 includes not only the gate drive units S and the light-emitting control units F arranged along the arc H, i.e., the gate drive units S and the light-emitting control units F located on a right side of FIG. 2, but also includes the gate drive units S and the light-emitting control units F not arranged along the arc H, i.e., the gate drive units S and the light-emitting control units F located on a left side of FIG. 2.

With further reference to FIG. 2, one light-emitting control unit F corresponds to n gate drive units S. Herein, n is an integer larger than 1. One light-emitting control unit F includes m straight portions. Herein, m is an integer and $1 < m \leq n$. An included angle between two adjacent straight portions is smaller than 180°. It should be noted that, FIG. 2 shows a case in which n=4 and m=2, that is, one light-emitting control unit F corresponds to four gate drive units and one light-emitting control unit F includes two straight portions, i.e., a first straight portion L1 and a second straight portion L2. The included angle between two adjacent straight portions, i.e., the included angle between the first straight portion L1 and the second straight portion L2, is smaller than 180°. In other words, the first straight portion L1 is not parallel to the second straight portion L2, and the light-emitting control unit F is in a form of a polyline, i.e., the light-emitting control unit F is bent at a certain angle.

For the organic light-emitting display panel 100 provided by this embodiment of the present disclosure, the light-emitting control unit F disposed along the arc H includes straight portions (for example, the first straight portion L1 and the second straight portion L2), and the included angle between two adjacent straight portions is smaller than 180°. Therefore, the light-emitting control units F can be arranged more effectively according to the arc H, so that a border of the organic light-emitting display panel 100 having a rounded edge can have a reduced width, thereby increasing the proportion of the display region of the organic light-emitting display panel 100.

According to embodiment of the present disclosure, FIG. 2 shows a dotted rectangular frame for illustrating a case where the light-emitting control unit F is not provided with straight portions and two adjacent straight portions are not in a form of polylines. As shown in FIG. 2, in this embodiment, a minimum distance between the light-emitting control unit F of the organic light-emitting display panel 100 and the arc H is a distance between an edge of the first straight portion L1 and the arc H. According to the present disclosure, the minimum distance between the light-emitting control unit F of the organic light-emitting display panel 100 and the arc H is a. When a minimum distance between the dotted rectangular frame and the arc H satisfies the same condition, that is, when the minimum distance between the dotted rectangular frame and the arc H is also a, a distance between an upper end of the dotted rectangular frame and the arc H is larger than a. In this case, space between the upper end of the dotted rectangular frame and the arc H is not well used, and the width of the border here is increased. In other words, in this case, the dotted rectangular frame is not specifically designed according to the characteristics of the arc H. The arc H has a concave or convex degree according to the curvature degree, and the most reasonable use of the space of the dotted rectangular frame is merely be parallel to a tangential line of the arc H, and thus the space between two ends of the dotted rectangular frame and the arc H cannot be effectively utilized. For the organic light-emitting display panel 100 provided by this embodiment of the present disclosure, the light-emitting control unit F includes straight portions that are not parallel to each other, and corners can be provided according to a curvature degree of the arc H (i.e., a curvature radius R of the arc H, and herein, the curvature radius refers to a curvature of a plane curve, which is a rotation rate of a tangent directional angle to an arc length for a point on the curve, and is used to indicate a degree to which the curve deviates from the straight line; and for a curve, its curvature radius is equal to a radius of an arc closest to the curve at this point). In this way, it can mate with the arc H better, thereby reducing the width of the border.

Figure 3:
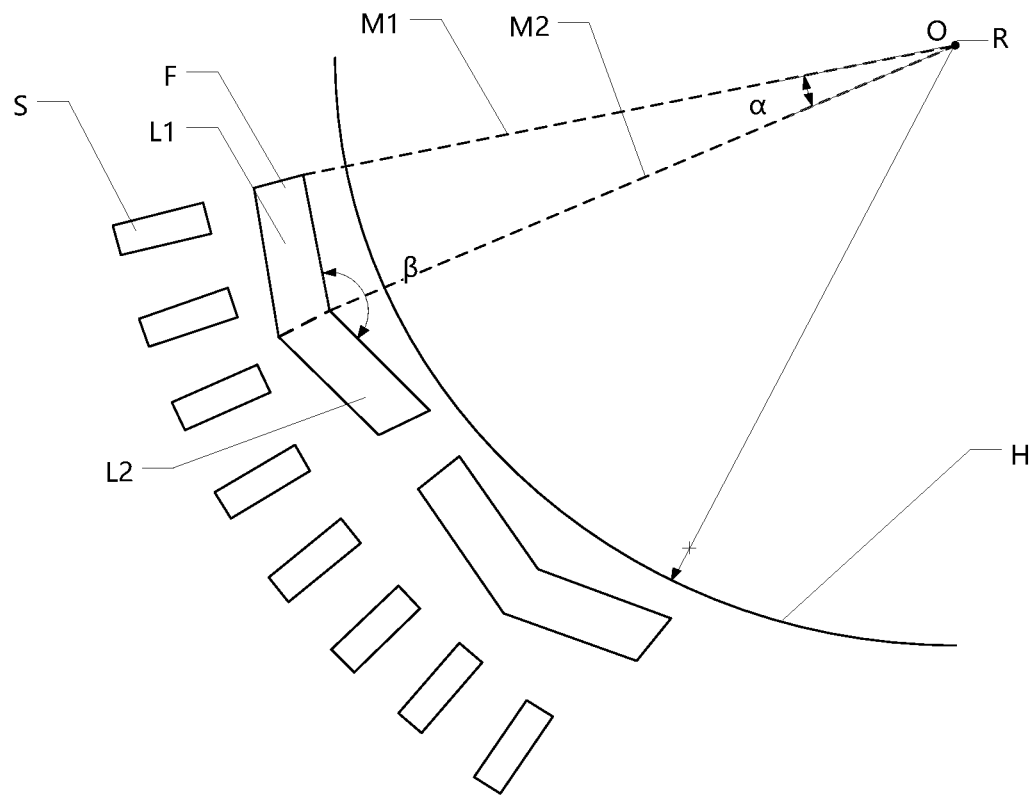
FIG. 3 is a schematic diagram of a light-emitting control unit of an organic light-emitting display panel according to an embodiment of the present disclosure.

This embodiment of the present disclosure also provides solutions for designing the light-emitting control unit F according to the arc H. An embodiment of the present disclosure further provides an organic light-emitting display panel 100. As shown in FIG. 3, the light-emitting control unit F includes a first straight portion L1 and a second straight portion L2. A line connecting a first end of the first straight portion L1 with a circle center O of the arc H is referred to as a first connection line M1. A line connecting a second end of the first straight portion L1 with the circle center O of the arc H is referred to as a second connection line M2. An included angle between the first connection line M1 and the second connection line M2 is referred to as a first included angle $\alpha$. The first straight portion L1 is adjacent to the second straight portion L2. An included angle between the first straight portion L1 and the second straight portion L2 is referred to as a second included angle $\beta$. An angular degree y of the second included angle $\beta$ and an angular degree x of the first included angle $\alpha$ satisfy: $y \geq 180° - x$, where x>0 and y>0. That is, a sum of the angular degree y of the second included angle $\beta$ and the angular degree x of the first included angle $\alpha$ is larger than 180°.

Figure 4:
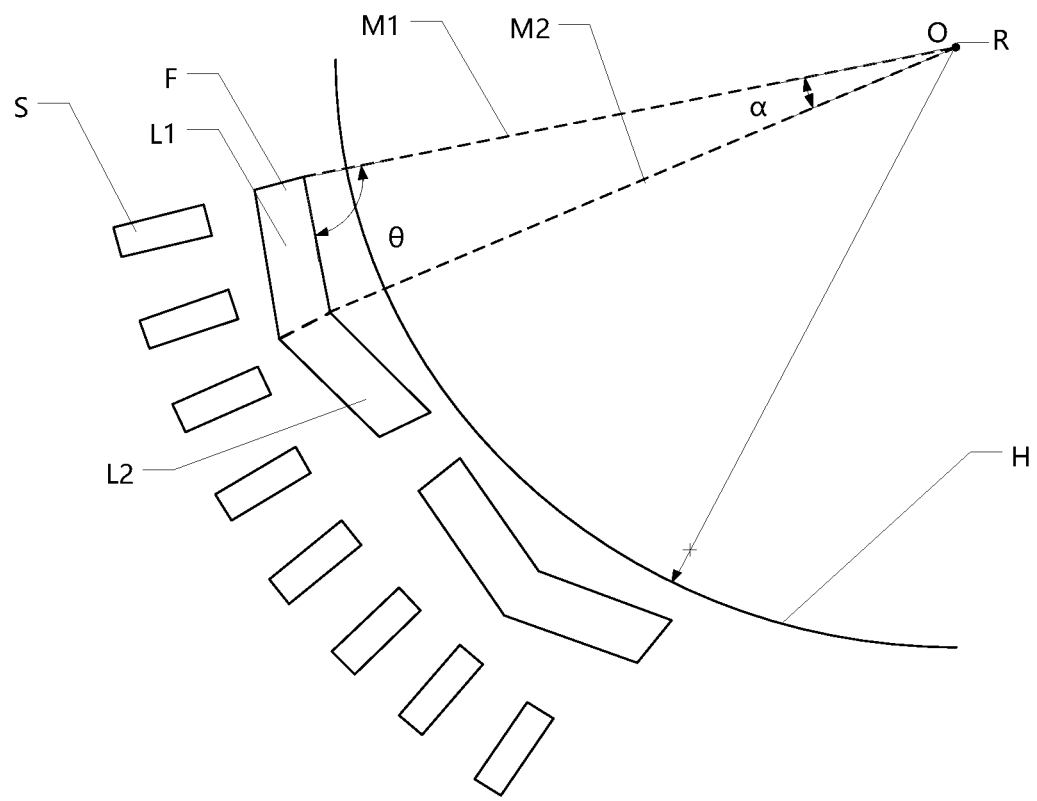
FIG. 4 is a schematic diagram of a light-emitting control unit of another organic light-emitting display panel according to an embodiment of the present disclosure.

Further, an embodiment of the present disclosure further provides an organic light-emitting display panel 100. As shown in FIG. 4, the light-emitting control unit F includes a first straight portion L1 and a second straight portion L2. A line connecting a first end of the first straight portion L1 with a circle center O of the arc H is referred to as a first connection line M1. A line connecting a second end of the first straight portion L1 with the circle center O of the arc H is referred to as a second connection line M2. An included angle between the first connection line M1 and the second connection line M2 is referred to as a first included angle $\alpha$. An included angle between the first connection line M1 and the first straight portion L1 is referred to as a third included angle $\theta$. The angular degree z of the third included angle $\theta$ and the angular degree x of the first included angle $\alpha$ satisfy: $z \leq 90° - x/2$, where z>0. That is, two sides of the third included angle $\theta$ and an angular bisector of the first included angle $\alpha$ form a right triangle or an obtuse triangle.

For the organic light-emitting display panel 100 provided by this embodiment of the present disclosure, the included angle between two adjacent straight portions of the light-emitting control unit F is set to be within a certain range. That is, a bending degree of the light-emitting control unit F is set in such a manner that, in connection with the curvature of the arc H, it is more advantageous for designing according to the arc H, thereby further reducing the width of border of the organic light-emitting display panel 100.

Figure 5:
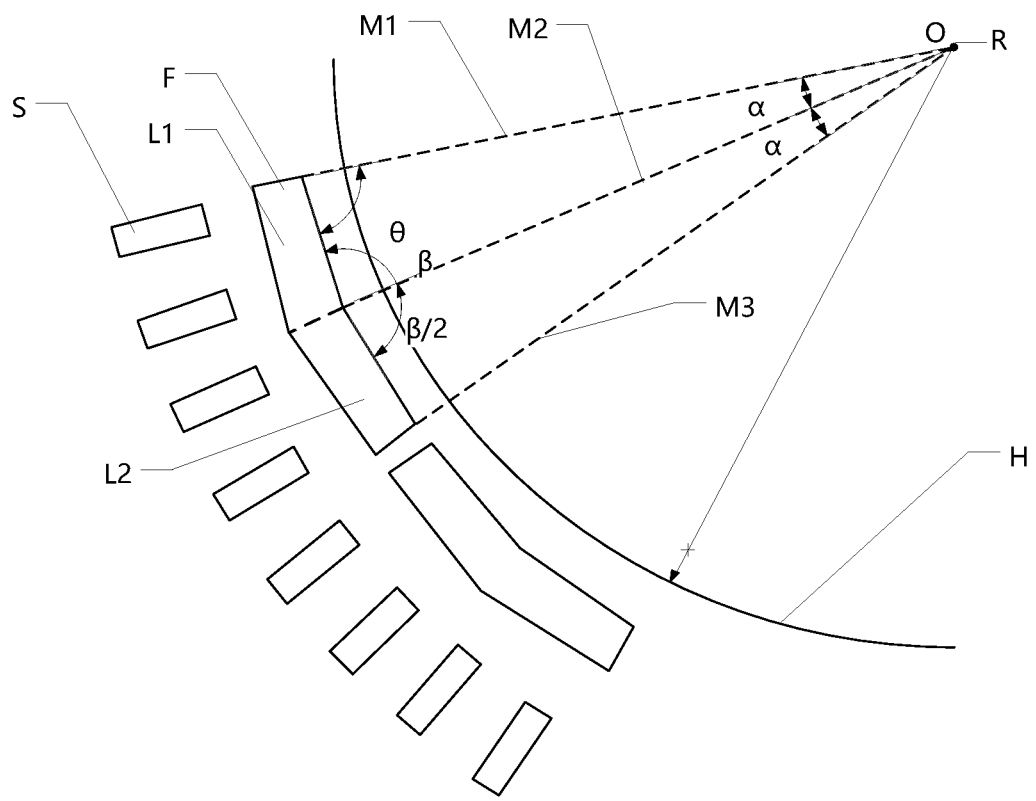
FIG. 5 is a schematic diagram of a light-emitting control unit of still another organic light-emitting display panel according to an embodiment of the present disclosure.

An embodiment of the present disclosure further provides an organic light-emitting display panel 100. As shown in FIG. 5, the first straight portion L1 is equal to the second straight portion L2. The included angle between the first connection line M1 and the second connection line M2 is a first included angle $\alpha$. The included angle between the first straight portion L1 and the second straight portion L2 is a second included angle $\beta$. The included angle between the first connection line M1 and the first straight portion L1 is a third included angle $\theta$.

Further, with reference to FIG. 5, the first connection line M1, the second connection line M2, and the first straight portion L1 form an isosceles triangle. That is, a length of the first connection line M1 is equal to a length of the second connection line M2. In this case, the angular degree of the third included angle $\theta$ is equal to an angular degree of the included angle between the second connection line M2 and the first straight portion L1. In the isosceles triangle formed by the first connection line M1, the second connection line M2, and the first straight portion L1, a sum of angular degrees of two bottom angles and an apex angle is 180°. That is, a sum of twice the angular degree z of the third included angle $\theta$ and the angular degree x of the first included angle $\alpha$ is 180°, i.e., $2z + x = 180°$. That is, the angular degree z of the third included angle $\theta$ and angular degree x of the first included angle $\alpha$ satisfy: $z + x/2 = 90°$.

Further, with reference to FIG. 5, a portion of the second straight portion L2 contacting the first straight portion L1 is the first end of the second straight portion L2, and a line connecting the second end of the second straight portion L2 with the circle center O is the third connection line M3. The third connection line M3, the second connection line M2, and the first connection line M1 have a same length. In this case, the third connection line M3, the second connection line M2, and the second straight portion L2 form an isosceles triangle. The third included angle $\theta$, the included angle between the second connection line M2 and an first straight portion L1, and the included angle between the second connection line M2 and the second straight portion L2 have a same angular degree. A sum of the angular degree of the included angle between the second connection line M2 and the first straight portion L1 and the angular degree of the included angle between the second connection line M2 and the second straight portion L2 is equal to the angular degree y of the second included angle $\beta$. That is, the angular degree z of the third included angle $\theta$ and the angular degree y of the second included angle $\beta$ satisfy: $z = y/2$. In this case, for a quadrilateral formed by the first connection line M1, the first straight portion L1, the second straight portion L2, and the third connection line M3, a sum of four inner angles is 360°. That is, the angular degree y/2 of the third included angle $\theta$, the angular degree y of the second included angle $\beta$, and twice the angular degree x of the first included angle $\alpha$ satisfy: $y/2 + y + y/2 + x + x = 360°$, i.e., $x + y = 180°$. In other words, the angular degree y of the second included angle $\beta$ and the angular degree x of the first included angle $\alpha$ satisfy: $x + y = 180°$.

For the organic light-emitting display panel 100 provided by the embodiment of the present disclosure, since the length of the first straight portion L1 is equal to the length of the second straight portion L2, the space of the light-emitting control unit F1 can be more reasonably designed and more easily matched up with the pixel units P arranged in an array. In this way, adjacent gate lines G can have a substantially same distance therebetween. It is more convenient for the light-emitting control line EM to pass through a gap between adjacent gate drive units S, such that y adjacent light-emitting control lines EM can have a substantially same distance therebetween. The organic light-emitting display panel 100 provided by this embodiment of the present disclosure has a simple and reasonable wiring design while reducing the border.

Figure 6A:
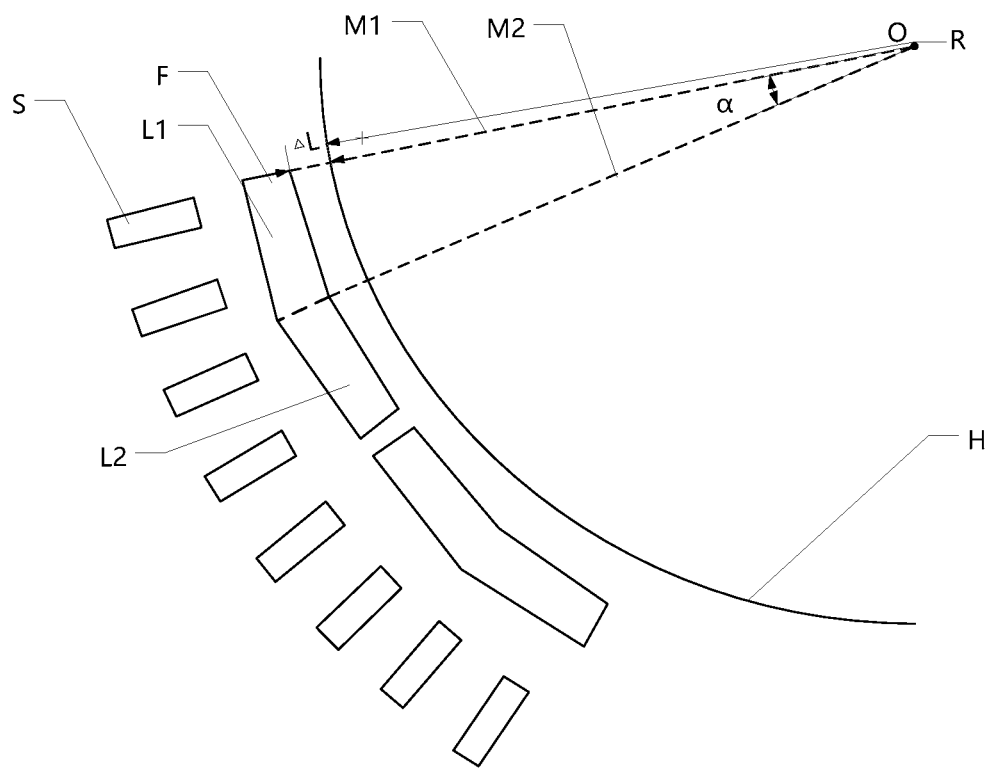
FIG. 6A is a schematic diagram of a light-emitting control unit of yet another organic light-emitting display panel according to an embodiment of the present disclosure.

An embodiment of the present disclosure further provides an organic light-emitting display panel 100. As shown in FIG. 6A, a line connecting the first end of the first straight portion L1 with the circle center O of the arc H is the first connection line M1. The line connecting the second end of the line portion L1 with the circle center O of the arc H is the second connection line M2. The included angle between the first connection line M1 and the second connection line M2 is the first included angle $\alpha$. The length of the first connection line M1 is larger than the curvature radius R of the arc H. The length of the second connection line M2 is larger than the curvature radius R of the arc H. FIG. 6A shows a relation between the length of the first connection line M1 and the curvature radius R of the arc H when the light-emitting control unit F is disposed on a side of the arc H facing away from the circle center, i.e., disposed on a convex side of the arc H.

Figure 6B:
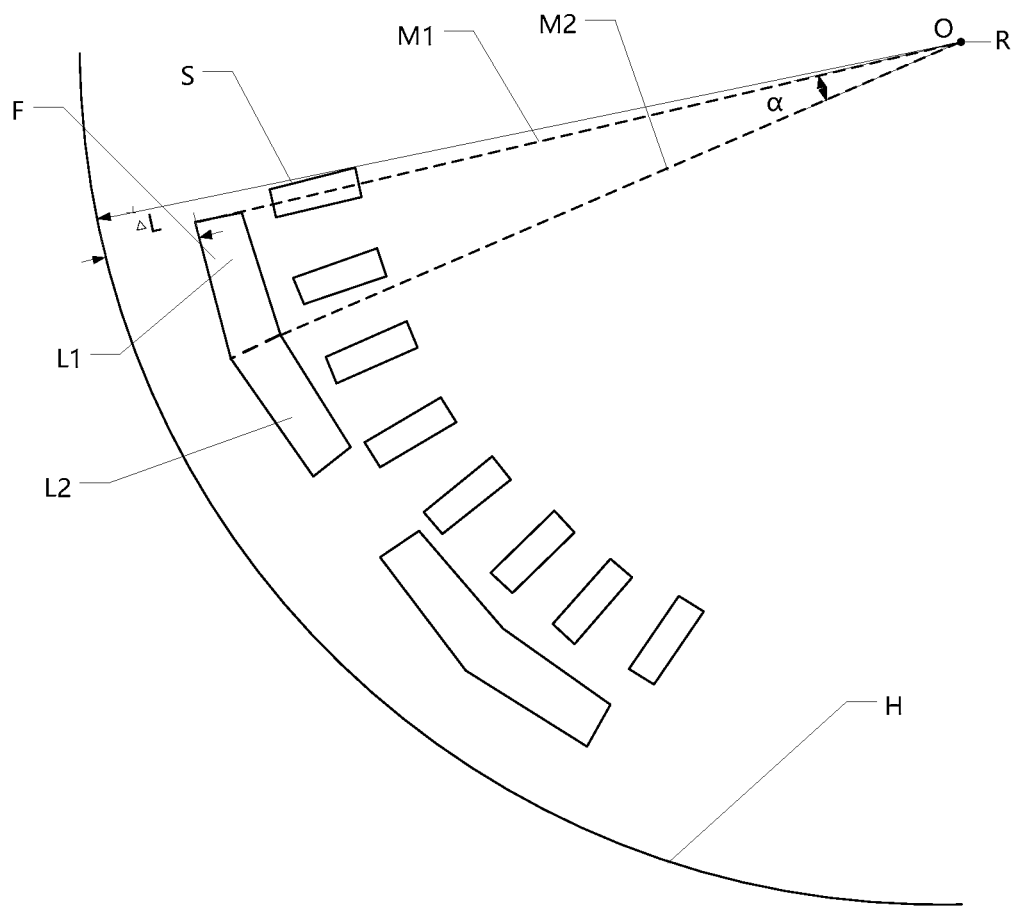
FIG. 6B is a schematic diagram of a light-emitting control unit of yet another organic light-emitting display panel according to an embodiment of the present disclosure.

In other embodiments of the present disclosure, as shown in FIG. 6B, the light-emitting control unit F is disposed on a side of the arc H facing towards the circle center, i.e., the light-emitting control unit F is disposed on a concave side of the arc H. As shown in FIG. 6B, a line connecting the first end of the first straight portion L1 with the circle center O of the arc H is the first connection line M1. A line connecting the second end of the first straight portion L1 with the circle center O of the arc H is the second connection line M2. The included angle between the first connection line M1 and the second connection line M2 is the first included angle $\alpha$. The length of the first connection line M1 is smaller than the curvature radius R of the arc H. The length of the second connection line M2 is smaller than the curvature radius R of the arc H.

Further, a difference between the curvature radius R of the arc and the length of the first connection line M1 is smaller than 0.5 mm, and a difference between the curvature radius R of the arc and the length of the second connection line M2 is smaller than 0.5 mm. It should be noted that the difference between the curvature radius R of the arc and the length of the first connection line M1 is an absolute value of the difference between the curvature radius R of the arc and the length of the first connection line M1. When the curvature radius R of the arc is larger than the length of the first connection line M1, the curvature radius R of the arc minus first connection line M1 is smaller than 0.5; and when the curvature radius R of the arc is smaller than the length of the first connection line M1, the length of the first connection line M1 minus the curvature radius R of the arc is smaller than 0.5.

Further, as shown in FIG. 1 and FIG. 2, the length of the first straight portion L1 is larger than or equal to twice the length of the pixel unit P. That is, when the light-emitting control unit F2 corresponds to at least two rows of pixel units P, the light-emitting control unit F2 is designed to include at least two straight portions that are in a form of polylines.

In an embodiment, as shown in FIG. 5 and FIG. 1, one light-emitting control unit F corresponds to four gate drive units S, and one light-emitting control unit F includes two straight portions, i.e., a first straight portion L1 and a second straight portion L2. One light-emitting control unit F corresponding to four gate drive units S means that a length of one light-emitting control unit F in an extending direction of the data line D is equal to a total length of four gate drive units S in the extending direction of the data line D, that is, the length of one light-emitting control unit F in the extending direction of the data line D is larger than a total length of three gate drive units S and smaller than a total length of five gate drive units S in the extending direction of the data line D.

With further reference to FIG. 1 and FIG. 5, a straight line where the first straight portion L1 is in contact with the second straight portion L2 is an angular bisector of the included angle between the first straight portion L1 and the second straight portion L2. That is, the straight line where the first straight portion L1 is in contact with the second straight portion L2 bisects the second included angle $\beta$.

Further, the length of the first straight portion L1 is equal to the length of the second straight portion L2.

Figure 7:
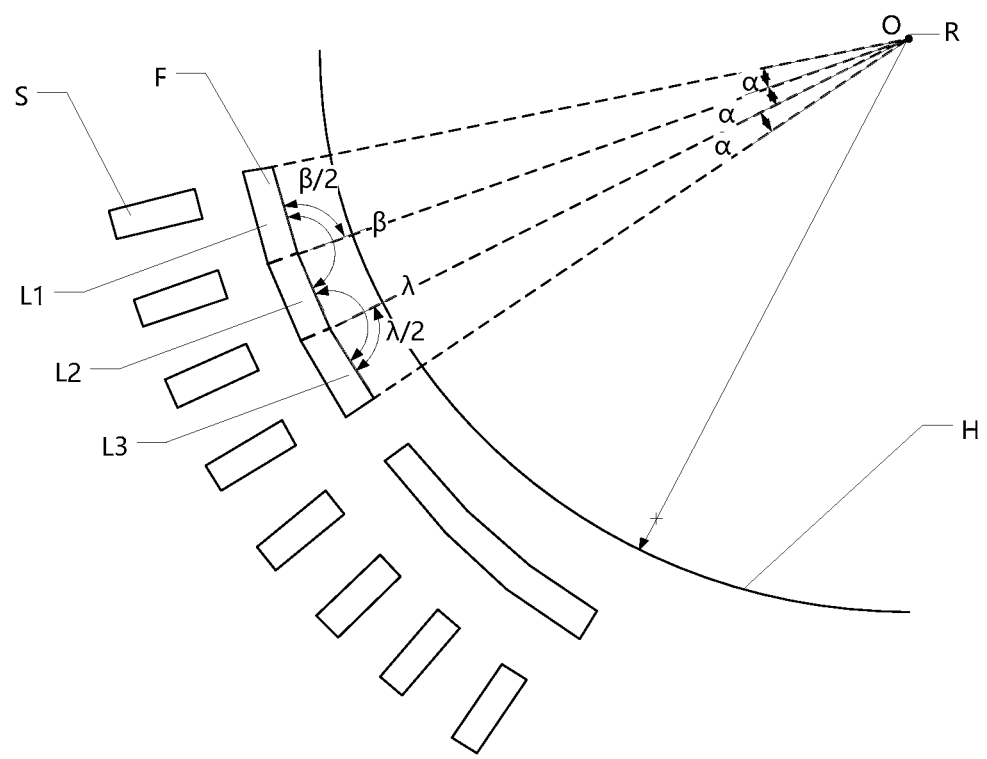
FIG. 7 is a schematic diagram of a light-emitting control unit of yet another organic light-emitting display panel according to an embodiment of the present disclosure.

An embodiment of the present disclosure further provides an organic light-emitting display panel 100. As shown in FIG. 7, one light-emitting control unit F of the organic light-emitting display panel 100 corresponds to four gate drive units S, and one light-emitting control unit F includes only three straight portions, i.e., a first straight portion L1, a second straight portion L2, and a third straight portion L3. A first end of the second straight portion L2 contacts the first straight portion L1, and a second end of the second straight portion L2 contacts the third straight portion L3. Further, a straight line where the first straight portion L1 is in contact with the second straight portion L2 is an angular bisector of the included angle between the first straight portion L1 and the second straight portion L2. That is, the included angle between the first straight portion and the second straight portion is the second included angle $\beta$, and the straight line where the first straight portion L1 is in contact with the second straight portion L2 bisects the second included angle $\beta$. Further, the straight line where the first straight portion L1 is in contact with the second straight portion L2 passes through the circle center O, that is, a line connecting a point where the first straight portion L1 is in contact with the second straight portion L2 with the circle center O is just the straight line where the first straight portion L1 is in contact with the second straight portion L2.

Further, the straight line where the third straight portion L3 is in contact with the second straight portion L2 is an angular bisector of an included angle between the third straight portion L3 and the second straight portion L2. That is, the included angle between the third straight portion L3 and the second straight portion L2 is a fourth included angle $\lambda$, and the straight line where the third straight portion L3 is in contact with the second straight portion L2 bisects the fourth included angle $\lambda$. Further, the straight line where the third straight portion L3 is in contact with the second straight portion L2 passes through the circle center O, that is, a line connecting a point where the third straight portion L3 is in contact with the second straight portion L2 with the circle center O is just the straight line where the third straight portion L3 is in contact with the second straight portion L2.

With further reference to FIG. 7, the included angle between the first straight portion L1 and the second straight portion L2 is the second included angle $\beta$, and the included angle between the third straight portion L3 and the second straight portion L2 is the fourth included angle $\lambda$. Here, the second included angle $\beta$ and the fourth included angle $\lambda$ have a same angular degree.

Further, the first straight portion L1 and the third straight portion L3 have a same length.

It should be noted that the above embodiments of the present disclosure provide cases where the light-emitting control unit F includes two straight portions or three straight portions, however, in other embodiments of the present disclosure, the light-emitting control unit F may include four, five or more straight sections.

Figure 8:
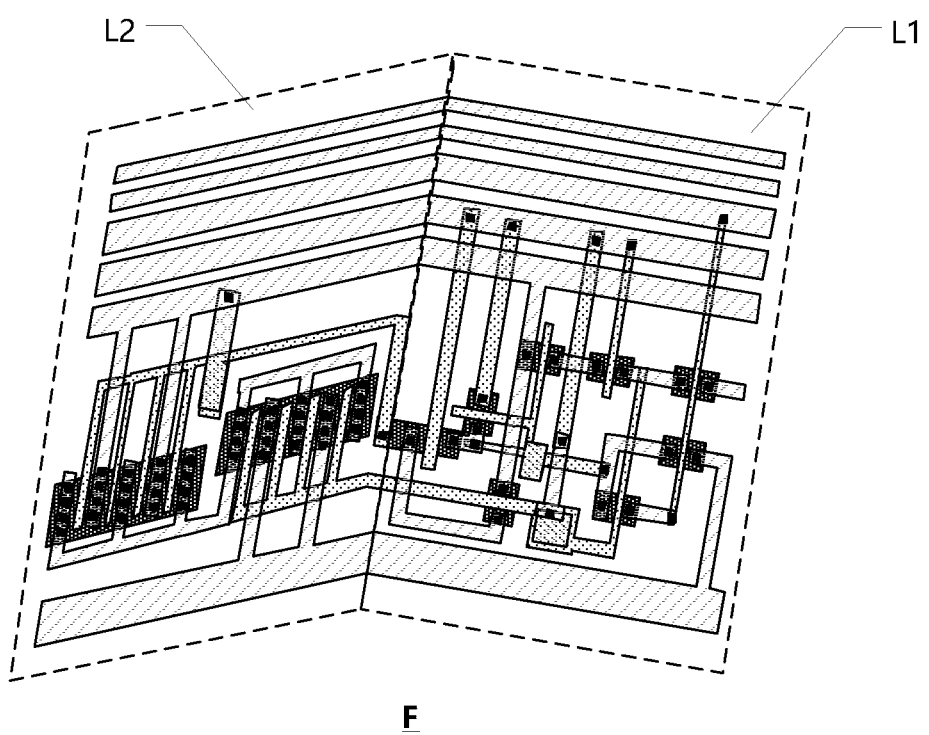
FIG. 8 illustrates a layout diagram of a light-emitting control unit of an organic light-emitting display panel according to an embodiment of the present disclosure.

FIG. 8 illustrates a layout design of a light-emitting control unit F according to an embodiment of the present disclosure. As shown in FIG. 8, the light-emitting control unit F includes a first straight portion L1 and a second straight portion L2. The included angle between the first straight portion L1 and the second straight portion L2 is smaller than 180°. The second straight portion L2 includes two transistors having the longest aspect ratio, and the first straight portion includes transistors having a relatively short aspect ratio. Transistors can adopt different wiring manners depending on the circuit design.

Figure 9:
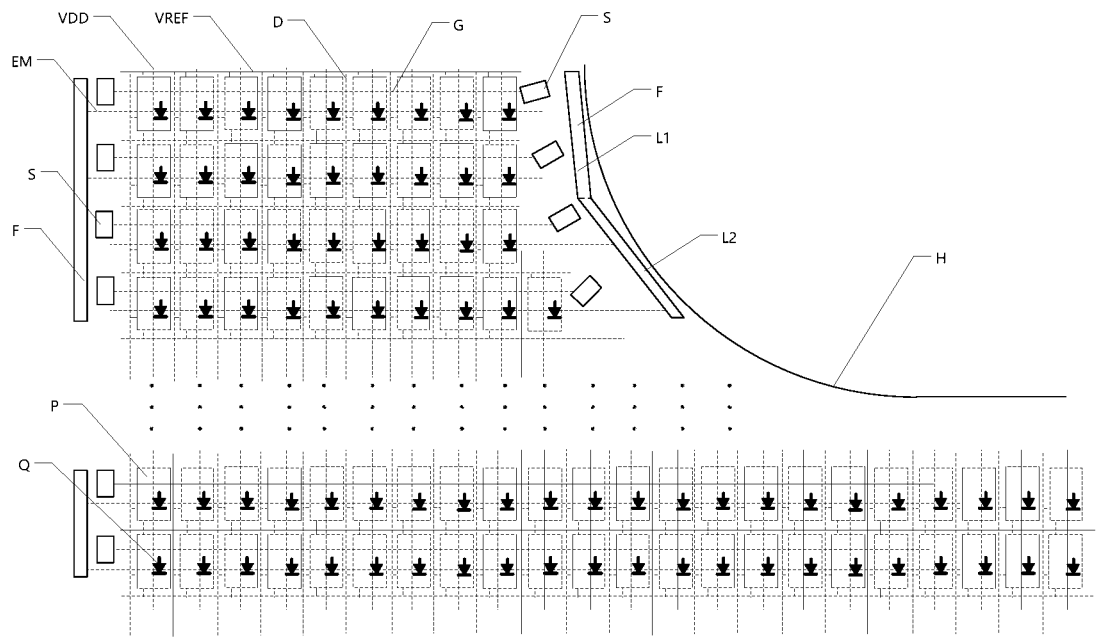
FIG. 9 is an enlarged view of an arc-shaped edge of another organic light-emitting display panel according to an embodiment of the present disclosure.
Figure 10:
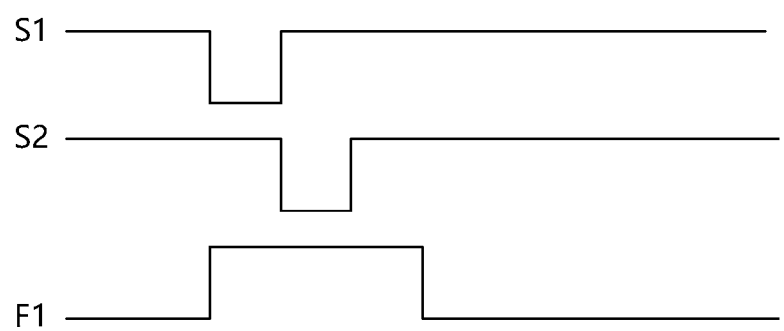
FIG. 10 is a signal diagram of a light-emitting control unit of an organic light-emitting display panel according to an embodiment of the present disclosure.

It should be noted that of the organic light-emitting display panel 100 in this embodiment adopts a bilateral driving manner of the light-emitting control unit F. In other embodiments of the present disclosure, the light-emitting display panel 100 may adopt an alternate driving manner of the light-emitting control unit F. As shown in FIG. 9, one light-emitting control unit F corresponds to four rows of pixel units P, and each light-emitting control unit F is electrically connected to two light-emitting control lines EM. Each row of pixel units P is driven by two adjacent gate lines G and one light-emitting control line EM. FIG. 10 shows signals provided by two adjacent gate lines G and one light-emitting control line EM. A signal S2 provided by a second gate line G is shifted by one cycle compared with a signal S1 provided by a first gate line G, and an enable phase of a signal F1 provided by the light-emitting control line EM simultaneously covers the signal S1 provided by the first gate line G and the signal S2 provided by the second gate line G.

Figure 11:
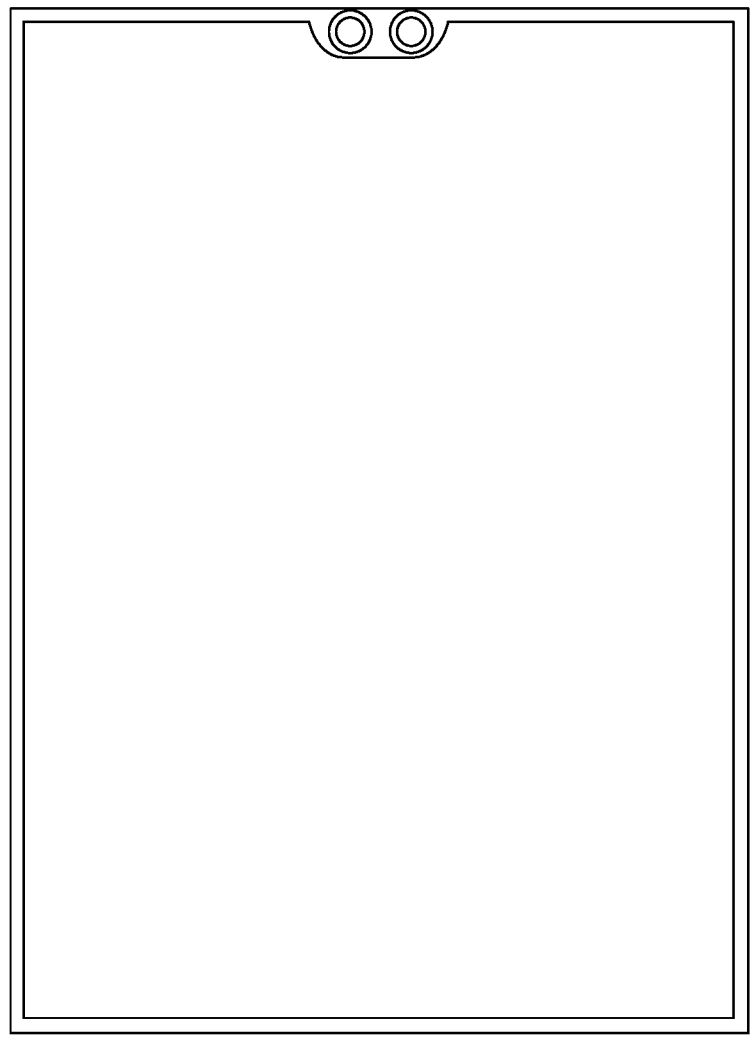
FIG. 11 is a top view of an organic light-emitting display device according to an embodiment of the present disclosure.

An embodiment of the present disclosure further provides an organic light-emitting display device 500. As shown in FIG. 11, the organic light-emitting display device 500 includes the organic light-emitting display panel 100 provided by the embodiments of the present disclosure.

It should be noted that FIG. 11 merely shows one shape of the organic light-emitting display device 500. In other embodiments of the present disclosure, the organic light-emitting display device 500 may also have other shapes, such as a circular shape, an elliptical shape, a non-rectangular shape, etc. The non-display region of the organic light-emitting display device 500 can be provided with a notch, a digging, a water drop, and the like.

For the organic light-emitting display device 500 provided by this embodiment of the present disclosure, the light-emitting control unit F disposed along the arc H includes straight portions, and the included angle between two adjacent straight portions is smaller than 180°. Therefore, the light-emitting control units F can be arranged more effectively according to the arc H, so that the border of the organic light-emitting display device 500 having a rounded edge can have a reduced width, thereby increasing the proportion of the display region of the organic light-emitting display device 500.

The device embodiments described above are merely illustrative, the units illustrated as separate components may or may not be physically separated, and the components shown as units may or may not be physical units, i.e., they may be located in one place, or may be distributed to at least two network units. Some or all of the modules may be selected according to actual needs to achieve the purpose of the solution of the embodiment.

Finally, it should be noted that, the above-described embodiments are merely for illustrating the present disclosure but not intended to provide any limitation. Although the present disclosure has been described in detail with reference to the above-described embodiments.

What is claimed is:

1. An organic light-emitting display panel, comprising:
   a plurality of gate lines;
   a plurality of data lines intersecting with and insulated from the plurality of gate lines;
   a plurality of light-emitting control lines;
   a plurality of pixel units;
   a plurality of gate drive units electrically connected to the plurality of gate lines; and
   a plurality of light-emitting control units electrically connected to the plurality of light-emitting control lines,
   wherein the plurality of gate drive units and the plurality of light-emitting control units are arranged along an arc, which has a curvature radius of R, where R>0;
   each of the plurality of light-emitting control units corresponds to n gate drive units of the plurality of gate drive units, where n is an integer larger than 1;
   each of the plurality of light-emitting control units comprises m straight portions, where m is an integer and $1 < m \leq n$; and
   an included angle between two adjacent straight portions of the m straight portions is smaller than 180°.

2. The organic light-emitting display panel according to claim 1, wherein each of the m straight portions has a first end and second end, a line connecting the first end with a circle center of the arc is a first connection line, a line connecting the second end with the circle center is a second connection line, and an included angle between the first connection line and the second connection line is a first included angle, and
   an included angle between the two adjacent straight portions is a second included angle, and an angular degree y of the second included angle and an angular degree x of the first included angle satisfy: $y \geq 180° - x$, where $x > 0$ and $y > 0$.

3. The organic light-emitting display panel according to claim 2, wherein an included angle between each of the m straight portions and the first connection line connecting the first end of the straight portion with the circle center is a third included angle, and an angular degree z of the third included angle and the angular degree x of the first included angle satisfy: $z \leq 90° - x/2$, $z > 0$.

4. The organic light-emitting display panel according to claim 2, wherein the two adjacent straight portions have a same length.

5. The organic light-emitting display panel according to claim 4, wherein the first connection line, the second connection line, and each of the m s straight portions form an isosceles triangle.

6. The organic light-emitting display panel according to claim 2, wherein the angular degree y of the second included angle and the angular degree x of the first included angle satisfy: $x + y = 180°$.

7. The organic light-emitting display panel according to claim 2, wherein an included angle between the first connection line and each of the m straight portions is a third included angle, and an angular degree z of the third included angle and the angular degree x of the first included angle satisfy: $z + x/2 = 90°$.

8. The organic light-emitting display panel according to claim 1, wherein each of the m straight portions has a first end a second end, a line connecting the first end with a circle center of the arc is a first connection line, a line connecting the second end with the circle center is a second connection line, and an included angle between the first connection line and the second connection line is a first included angle, and
   a length of the first connection line is smaller than the curvature radius R of the arc, and a length of the second connection line is smaller than the curvature radius R of the arc.

9. The organic light-emitting display panel according to claim 8, wherein a difference between the curvature radius R of the arc and the length of the first connection line is smaller than 0.5 mm, and a difference between the curvature radius R of the arc and the length of the second connection line is smaller than 0.5 mm.

10. The organic light-emitting display panel according to claim 1, wherein a length of each of the m straight portions is larger than or equal to twice a length of each of the plurality of pixel units.

11. The organic light-emitting display panel according to claim 1, wherein each of the plurality of light-emitting control units corresponds to four gate drive units of the plurality of gate drive units, and each of the plurality of light-emitting control units comprises two straight portions, which are a first straight portion and a second straight portion, respectively.

12. The organic light-emitting display panel according to claim 11, wherein a straight line where the first straight portion is in contact with the second straight portion is an angular bisector of an included angle between the first straight portion the second straight portion.

13. The organic light-emitting display panel according to claim 11, wherein the first straight portion and the second straight portion have a same length.

14. The organic light-emitting display panel according to claim 1, wherein each of the plurality of light-emitting control units corresponds to four gate drive units of the plurality of gate drive units, and each of the plurality of light-emitting control units comprises three straight portions, which are a first straight portion, a second straight portion and a third straight portion, respectively, and
the second straight portion has a first end contacting the first straight portion, and a second end contacting the third straight portion.

15. The organic light-emitting display panel according to claim 14, wherein a straight line where the first straight portion is in contact with the second straight portion is an angular bisector of an included angle between the first straight portion the second straight portion.

16. The organic light-emitting display panel according to claim 14, wherein a straight line where the third straight portion is in contact with the second straight portion is an angular bisector of an included angle between the third straight portion the second straight portion.

17. The organic light-emitting display panel according to claim 14, wherein an included angle between the first straight portion and the second straight portion and an included angle between the third straight portion and the second straight portion have a same angular degree.

18. The organic light-emitting display panel according to claim 14, wherein the first straight portion and the third straight portion have a same length.

19. An organic light-emitting display device, comprising:
an organic light-emitting display panel comprising:
a plurality of gate lines;
a plurality of data lines intersecting with and insulated from the plurality of gate lines;
a plurality of light-emitting control lines;
a plurality of pixel units;
a plurality of gate drive units electrically connected to the plurality of gate lines; and
a plurality of light-emitting control units electrically connected to the plurality of light-emitting control lines,
wherein the plurality of gate drive units and the plurality of light-emitting control units are arranged along an arc, which has a curvature radius of R, where R>0;
each of the plurality of light-emitting control units corresponds to n gate drive units of the plurality of gate drive units, where n is an integer larger than 1;
each of the plurality of light-emitting control units comprises m straight portions, where m is an integer and 1<m≤n; and
an included angle between two adjacent straight portions of the m straight portions is smaller than 180°.

* * * * *